(12) United States Patent
Lee

(10) Patent No.: US 8,519,783 B2
(45) Date of Patent: Aug. 27, 2013

(54) INTERNAL VOLTAGE GENERATING CIRCUIT

(75) Inventor: Se Won Lee, Asan-si (KR)

(73) Assignee: SK Hynix Inc., Gyeonggi-do (KR)

( * ) Notice: Subject to any disclaimer, the term of this patent is extended or adjusted under 35 U.S.C. 154(b) by 40 days.

(21) Appl. No.: 13/191,801

(22) Filed: Jul. 27, 2011

(65) Prior Publication Data

US 2012/0218006 A1   Aug. 30, 2012

(30) Foreign Application Priority Data

Feb. 28, 2011   (KR) .................. 10-2011-0018171

(51) Int. Cl.
  *G05F 1/10*   (2006.01)
  *G05F 3/02*   (2006.01)

(52) U.S. Cl.
  USPC ............ 327/541; 327/540; 327/543; 323/313

(58) Field of Classification Search
  USPC .......... 327/530, 538–543, 546; 323/312–317
  See application file for complete search history.

(56) References Cited

U.S. PATENT DOCUMENTS

| | | | |
|---|---|---|---|
| 4,906,914 A * | 3/1990 | Ohsawa .................. | 323/314 |
| 6,265,858 B1 * | 7/2001 | Park ....................... | 323/313 |
| 6,271,699 B1 * | 8/2001 | Dowlatabadi ........... | 327/170 |
| 6,426,670 B1 * | 7/2002 | Tanaka ................... | 327/541 |
| 6,867,639 B2 * | 3/2005 | Chun ...................... | 327/538 |
| 7,176,752 B2 * | 2/2007 | Hashimoto et al. .... | 327/541 |
| 7,365,595 B2 * | 4/2008 | Lee ......................... | 327/538 |
| 7,391,254 B2 * | 6/2008 | Lim et al. ............... | 327/538 |
| 7,453,748 B2 * | 11/2008 | Chang ..................... | 365/203 |
| 7,821,863 B2 * | 10/2010 | Takeuchi ................ | 365/226 |
| 2004/0251957 A1 * | 12/2004 | Do .......................... | 327/541 |
| 2009/0315531 A1 * | 12/2009 | Liao et al. ............... | 323/312 |

FOREIGN PATENT DOCUMENTS

KR    1020050095052 A    9/2005

* cited by examiner

*Primary Examiner* — Lincoln Donovan
*Assistant Examiner* — Brandon S Cole
(74) *Attorney, Agent, or Firm* — William Park & Associates Patent Ltd.

(57) ABSTRACT

An internal voltage generating circuit includes a drive signal generating unit, a drive signal controlling unit, and a driving unit. The drive signal generating unit is configured to compare an internal voltage with first and second reference voltages and generate a first pull-up drive signal and a first pull-down drive signal. The drive signal controlling unit is configured to buffer the first pull-up drive signal and the first pull-down drive signal and generate a second pull-up drive signal and a second pull-down drive signal, wherein the second pull-up drive signal and the second pull-down drive signal are deactivated when the first pull-up drive signal and the first pull-down drive signal are activated. The driving unit is configured to drive the internal voltage in response to the second pull-up drive signal and the second pull-down drive signal.

20 Claims, 5 Drawing Sheets

INTERNAL VOLTAGE GENERATING CIRCUIT

CROSS-REFERENCES TO RELATED APPLICATIONS

The present application claims priority under 35 U.S.C 119(a) to Korean Application No. 10-2011-0018171, filed on Feb. 28, 2011, in the Korean intellectual property Office, which is incorporated herein by reference in its entirety.

BACKGROUND

In general, a semiconductor memory device receives a power supply voltage VDD and a ground voltage VSS from an external device and generates internal voltages necessary for internal operations. Examples of the internal voltages include a core voltage VCORE supplied to a core region, a high voltage VPP used to drive a word line or used in an overdriving operation, and a back bias voltage VBB supplied as a bulk voltage of an NMOS transistor of the core region.

Examples of the internal voltages also include a cell plate voltage VCP used as a plate voltage of a cell capacitor, and a bit line precharge voltage VBLP used to precharge a bit line and the cell plate voltage VCP. In general, the cell plate voltage VCP is generated from the core voltage VCORE and is generated to be at half the level of the core voltage VCORE in order to minimize the power consumption.

In general, the cell plate voltage VCP and the bit line precharge voltage VBLP are generated by the same internal voltage generating circuit. When the level of the cell plate voltage VCP or the bit line precharge voltage VBLP is constant at half the level of the core voltage VCORE, a known internal voltage generating circuit stops driving the cell plate voltage VCP or the bit line precharge voltage VBLP. On the other hand, when the level of the cell plate voltage VCP or the bit line precharge voltage VBLP is higher or lower than half the level of the core voltage VCORE, the known internal voltage generating circuit drives the cell plate voltage VCP or the bit line precharge voltage VBLP. Here, the state of not driving the cell plate voltage VCP or the bit line precharge voltage VBLP, when the level of the cell plate voltage VCP or the bit line precharge voltage VBLP is constant at half the level of the core voltage VCORE, may be called a dead zone.

Meanwhile, the known internal voltage generating circuit is configured to compare the cell plate voltage VCP or the bit line precharge voltage VBLP with a plurality of reference voltages, and drive the cell plate voltage VCP or the bit line precharge voltage VBLP. When the cell plate voltage VCP or the bit line precharge voltage VBLP has a level between a high-level reference voltage and a low-level reference voltage, the known internal voltage generating circuit has the dead zone.

However, when the levels of reference voltages inputted into the internal voltage generating circuit varies according to a change in PVT (Process, Voltage and Temperature), that is, when an offset occurs, the level of a high-level reference voltage and the level of a low-level reference voltage may become reversed. When the levels of the reference voltages are reversed, the dead zone disappears and a short-circuit current occurs.

SUMMARY

An embodiment of the present invention relates to an internal voltage generating circuit that can prevent the occurrence of a short-circuit current by maintaining a dead zone even when the levels of reference voltages are reversed.

In one embodiment, an internal voltage generating circuit includes: a drive signal generating unit configured to compare an internal voltage with first and second reference voltages and generate a first pull-up drive signal and a first pull-down drive signal; a drive signal controlling unit configured to buffer the first pull-up drive signal and the first pull-down drive signal and generate a second pull-up drive signal and a second pull-down drive signal, wherein the second pull-up drive signal and the second pull-down drive signal are deactivated when the first pull-up drive signal and the first pull-down drive signal are activated; and a driving unit configured to drive the internal voltage in response to the second pull-up drive signal and the second pull-down drive signal.

In another embodiment, an internal voltage generating circuit includes: a drive signal generating unit configured to compare an internal voltage with first to fourth reference voltages and generate first and second pull-up drive signals and first and second pull-down drive signals; a first driving unit configured to drive the internal voltage in response to the first pull-up drive signal and the first pull-down drive signal; a drive signal controlling unit configured to buffer the second pull-up drive signal and the second pull-down drive signal and generate a third pull-up drive signal and a third pull-down drive signal, wherein the third pull-up drive signal and the third pull-down drive signal are deactivated when the second pull-up drive signal and the second pull-down drive signal are activated; and a second driving unit configured to drive the internal voltage in response to the third pull-up drive signal and the third pull-down drive signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
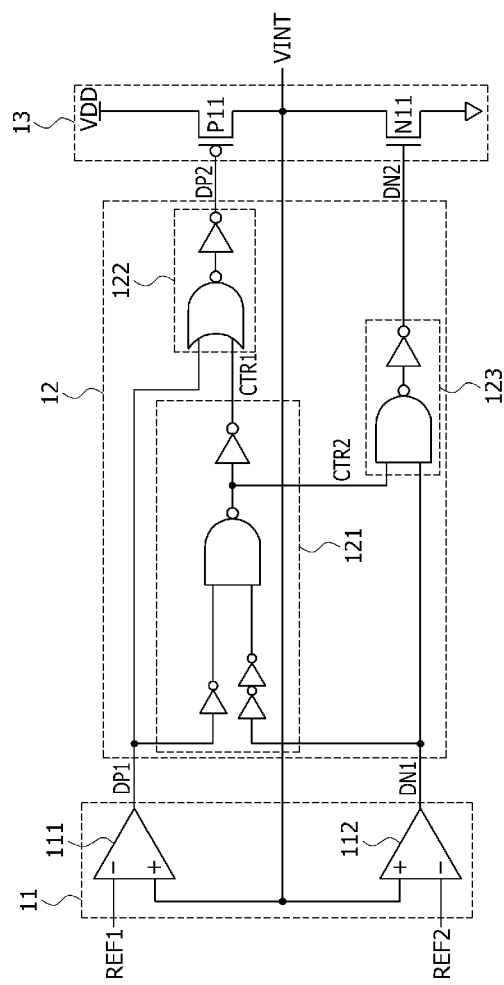
FIG. 1 is a block diagram of an internal voltage generating circuit according to an embodiment of the present invention.

FIG. 1 is a block diagram of an internal voltage generating circuit according to an embodiment of the present invention.

Referring to FIG. 1, an internal voltage generating circuit according to an embodiment of the present invention includes a drive signal generating unit 11 configured to compare an internal voltage VINT with first and second reference voltages REF1 and REF2, respectively, and generate a first pull-up drive signal DP1 and a first pull-down drive signal DN1, a drive signal controlling unit 12 configured to receive the first pull-up drive signal DP1 and the first pull-down drive signal DN1 and generate a second pull-up drive signal DP2 and a second pull-down drive signal DN2, and a driving unit 13 configured to drive the internal voltage VINT in response to the second pull-up drive signal DP2 and the second pull-down drive signal DN2.

The drive signal generating unit 11 includes a first comparator 111 configured to compare the internal voltage VINT with the first reference voltage REF1 and generate the first pull-up drive signal DP1, and a second comparator 112 configured to compare the internal voltage VINT with the second reference voltage REF2 and generate the first pull-down drive signal DN1. According to an example, the first reference voltage REF1 has a lower level than the second reference voltage REF2. The first pull-up drive signal DP1 is deactivated to a logic high level when the internal voltage VINT has a higher level than the first reference voltage REF1, and is activated to a logic low level when the internal voltage VINT has a lower level than the first reference voltage REF1. Also, the first pull-down drive signal DN1 is activated to a logic high level when the internal voltage VINT has a higher level than the second reference voltage REF2, and is deactivated to a logic low level when the internal voltage VINT has a lower level than the second reference voltage REF2.

The drive signal controlling unit 12 includes a control signal generating unit 121 configured to receive the first pull-up drive signal DP1 and the first pull-down drive signal DN1 and generate a first control signal CTR1 and a second control signal CRT2, a first buffer unit 122 configured to buffer the first pull-up drive signal DP1 and transmit the buffered first pull-up drive signal as the second pull-up drive signal DP2 in response to the first control signal CTR1, and a second buffer unit 123 configured to buffer the first pull-down drive signal DN1 and transmit the buffered first pull-down drive signal as the second pull-down drive signal DN2 in response to the second control signal CRT2. The control signal generating unit 121 generates the first control signal CTR1 of a logic high level and the second control signal CTR2 of a logic low level when the first pull-up drive signal DP1 is activated to a logic low level and the first pull-down drive signal DN1 is activated to a logic high level. By the first control signal CTR1 of a logic high level and the second control signal CTR2 of a logic low level, the second pull-up drive signal DP2 is deactivated to a logic high level and the second pull-down drive signal DN2 is deactivated to a logic low level.

The driving unit 13 includes a PMOS transistor P11 turned on to pull up the internal voltage VINT when receiving the second pull-up drive signal DP2 activated to a logic low level, and an NMOS transistor N11 turned on to pull down the internal voltage VINT when receiving the second pull-down drive signal DN2 activated to a logic high level.

Figure 2:
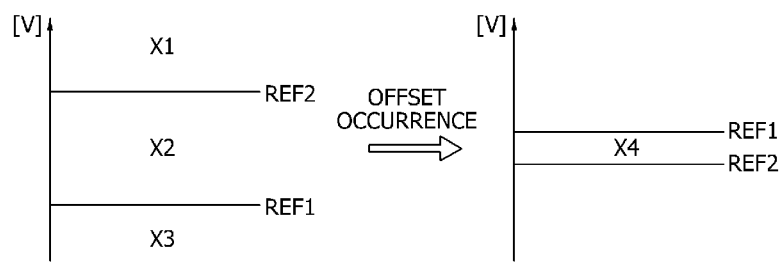
FIG. 2 is a diagram illustrating an example of an operation of the internal voltage generating circuit illustrated in FIG. 1.

FIG. 2 is a diagram illustrating an example of an operation of the internal voltage generating circuit illustrated in FIG. 1.

Referring to FIG. 2, when the internal voltage VINT has a level of a section X1 higher than the second reference voltage REF2, the first pull-up drive signal DP1 generated by the drive signal generating unit 11 is deactivated to a logic high level and the first pull-down drive signal DN1 is activated to a logic high level. In this state, since the first control signal CTR1 generated by the control signal generating unit 121 of the drive signal controlling unit 12 is at a logic low level and the second control signal CTR2 is at a logic high level, the second pull-up drive signal DP2 is deactivated to a logic high level by buffering the first pull-up drive signal DP1 and the second pull-down drive signal DN2 is activated to a logic high level by buffering the first pull-down drive signal DN1. Accordingly, the driving unit 13 pulls down the internal voltage VINT by the turned-on NMOS transistor N11.

When the internal voltage VINT has a level of a section X2 lower than the second reference voltage REF2 and higher than the first reference voltage REF1, the first pull-up drive signal DP1 generated by the drive signal generating unit 11 is deactivated to a logic high level and the first pull-down drive signal DN1 is deactivated to a logic low level. In this state, since the first control signal CTR1 generated by the control signal generating unit 121 of the drive signal controlling unit 12 is at a logic low level and the second control signal CTR2 is at a logic high level, the second pull-up drive signal DP2 is deactivated to a logic high level by buffering the first pull-up drive signal DP1 and the second pull-down drive signal DN2 is deactivated to a logic low level by buffering the first pull-down drive signal DN1. Accordingly, the PMOS transistor P11 and the NMOS transistor N11 of the driving unit 13 are turned off, and the internal voltage VINT is not driven, thus forming a dead zone.

When the internal voltage VINT has a level of a section X3 lower than the first reference voltage REF1, the first pull-up drive signal DP1 generated by the drive signal generating unit 11 is activated to a logic low level and the first pull-down drive signal DN1 is deactivated to a logic low level. In this state, since the first control signal CTR1 generated by the control signal generating unit 121 of the drive signal controlling unit 12 is at a logic low level and the second control signal CTR2 is at a logic high level, the second pull-up drive signal DP2 is activated to a logic low level by buffering the first pull-up drive signal DP1 and the second pull-down drive signal DN2 is deactivated to a logic low level by buffering the first pull-down drive signal DN1. Accordingly, the driving unit 13 pulls up the internal voltage VINT by the turned-on PMOS transistor P11.

An offset may occur according to a change in PVT (Process, Voltage and Temperature). Also, the level of the second reference voltage REF2 may become lower than the level of the first reference voltage REF1. In this state, when the internal voltage VINT has a level of a section X4 lower than the first reference voltage REF1 and higher than the second reference voltage REF2, the first pull-up drive signal DP1 generated by the drive signal generating unit 11 is activated to a logic low level and the first pull-down drive signal DN1 is activated to a logic high level. In this state, since the first control signal CTR1 generated by the control signal generating unit 121 of the drive signal controlling unit 12 is at a logic high level and the second control signal CTR2 is at a logic low level, the second pull-up drive signal DP2 is deactivated to a logic high level independent of the first pull-up drive signal DP1 and the second pull-down drive signal DN2 is deactivated to a logic low level independent of the first pull-down drive signal DN1. Accordingly, the PMOS transistor P11 and the NMOS transistor N11 of the driving unit 13 are turned off, and the internal voltage VINT is not driven, thus forming a dead zone.

As described above, the internal voltage generating circuit of this embodiment does not drive the internal voltage VINT by deactivating both the second pull-up drive signal DP2 and the second pull-down drive signal DN2 for driving the driving unit 13 even when an offset occurs between the reference voltages. Accordingly, the internal voltage generating circuit of this embodiment can maintain a dead zone and can remove a short-circuit current that is generated when the PMOS transistor P11 and the NMOS transistor N11 are simultaneously turned on.

Figure 3:
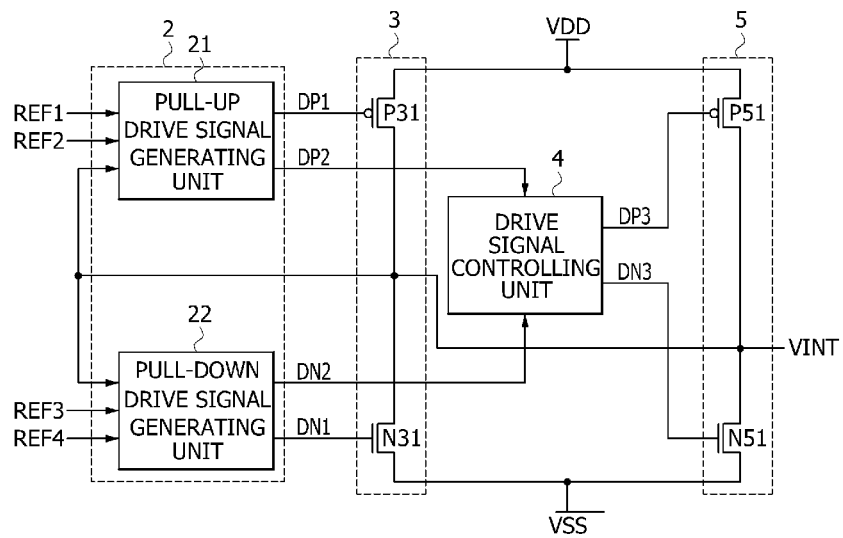
FIG. 3 is a block diagram of an internal voltage generating circuit according to another embodiment of the present invention.

FIG. 3 is a block diagram of an internal voltage generating circuit according to another embodiment of the present invention.

Referring to FIG. 3, an internal voltage generating circuit according to another embodiment of the present invention includes a drive signal generating unit 2, a first driving unit 3, a drive signal controlling unit 4, and a second driving unit 5. The drive signal generating unit 2 is configured to compare an internal voltage VINT with first to fourth reference voltages REF1 to REF4, respectively, and generate first and second pull-up drive signals DP1 and DP2 and first and second pull-down drive signals DN1 and DN2. The first driving unit 3 includes a PMOS transistor P31 configured to pull up the internal voltage VINT in response to the first pull-up drive signal DP1, and an NMOS transistor N31 configured to pull down the internal voltage VINT in response to the first pull-down drive signal DN1. The drive signal controlling unit 4 is configured to receive the second pull-up drive signal DP2 and the second pull-down drive signal DN2 and generate a third pull-up drive signal DP3 and a third pull-down drive signal DN3. The second driving unit 5 includes a PMOS transistor P51 configured to pull up the internal voltage VINT in response to the third pull-up drive signal DP3, and an NMOS transistor N51 configured to pull down the internal voltage VINT in response to the third pull-down drive signal DN3.

Specifically, the drive signal generating unit 2 includes a pull-up drive signal generating unit 21 configured to compare the internal voltage VINT with the first and second reference voltages REF1 and REF2, respectively, and generate the first and second pull-up drive signals DP1 and DP2, and a pull-down drive signal generating unit 22 configured to compare the internal voltage VINT with the third and fourth reference voltages REF3 and REF4, respectively, and generate the first and second pull-down drive signals DN1 and DN2.

Figure 4:
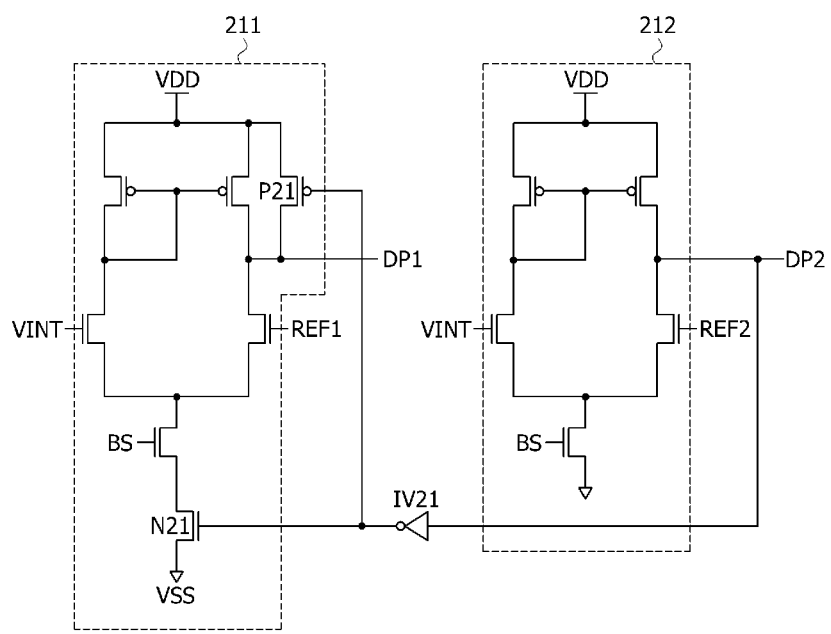
FIG. 4 is a circuit diagram of an example of a pull-up drive signal generating unit in the internal voltage generating circuit illustrated in FIG. 3.

FIG. 4 is a circuit diagram of an example of the pull-up drive signal generating unit 21 in the internal voltage generating circuit illustrated in FIG. 3.

Referring to FIG. 4, the pull-up drive signal generating unit 21 includes a first comparator 211 configured to compare the internal voltage VINT with the first reference voltage REF1 and generate the first pull-up drive signal DP1, and a second comparator 212 configured to compare the internal voltage VINT with the second reference voltage REF2 and generate the second pull-up drive signal DP2. According to an example, the second reference voltage REF2 has a higher level than the first reference voltage REF1. The first pull-up drive signal DP1 is deactivated to a logic high level when the internal voltage VINT has a higher level than the first reference voltage REF1, and is activated to a logic low level when the internal voltage VINT has a lower level than the first reference voltage REF1. Also, the second pull-up drive signal DP2 is deactivated to a logic high level when the internal voltage VINT has a higher level than the second reference voltage REF2, and is activated to a logic low level when the internal voltage VINT has a lower level than the second reference voltage REF2. According to an example, the first comparator 211 and the second comparator 212 are driven when a bank access signal BS is activated to a logic high level. The first comparator 211 generates the first pull-up drive signal DP1 by comparing the internal voltage VINT with the first reference voltage REF1, and by the NMOS transistor N21 that is turned on when the second pull-up drive signal DP2 is activated to a logic low level. Also, the first comparator 211 deactivates the first pull-up drive signal DP1 to a logic high level by pulling up the first pull-up drive signal DP1 by the PMOS transistor P21 that is turned on when the second pull-up drive signal DP2 is deactivated to a logic high level.

Figure 5:
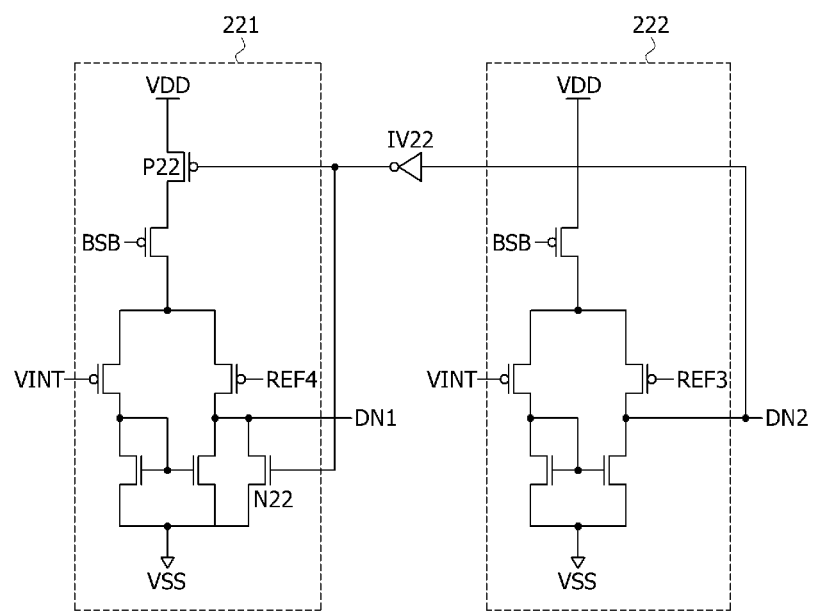
FIG. 5 is a circuit diagram of an example of a pull-down drive signal generating unit in the internal voltage generating circuit illustrated in FIG. 3.

FIG. 5 is a circuit diagram of an example of the pull-down drive signal generating unit 22 in the internal voltage generating circuit illustrated in FIG. 3.

Referring to FIG. 5, the pull-down drive signal generating unit 21 includes a third comparator 221 configured to compare the internal voltage VINT with the fourth reference voltage REF4 and generate the first pull-down drive signal DN1, and a fourth comparator 222 configured to compare the internal voltage VINT with the third reference voltage REF3 and generate the second pull-down drive signal DN2. According to an example, the fourth reference voltage REF4 has a higher level than the third reference voltage REF3, and the third reference voltage REF3 has a higher level than the second reference voltage REF2. The first pull-down drive signal DN1 is activated to a logic high level when the internal voltage VINT has a higher level than the fourth reference voltage REF4, and is deactivated to a logic low level when the internal voltage VINT has a lower level than the fourth reference voltage REF4. Also, the second pull-down drive signal DN2 is activated to a logic high level when the internal voltage VINT has a higher level than the third reference voltage REF3, and is deactivated to a logic low level when the internal voltage VINT has a lower level than the third reference voltage REF3. According to an example, the third comparator 221 and the fourth comparator 222 are driven when an inverted bank access signal BSB is activated to a logic low level. The third comparator 221 generates the first pull-down drive signal DN1 by comparing the internal voltage VINT with the fourth reference voltage REF4 and by the PMOS transistor P22 that is turned on when the second pull-down drive signal DN2 is activated to a logic low level. Also, the third comparator 221 deactivates the first pull-down drive signal DN1 to a logic low level by pulling down the first pull-down drive signal DN1 by the NMOS transistor N22 that is turned on when the second pull-down drive signal DN2 is deactivated to a logic low level.

Figure 6:
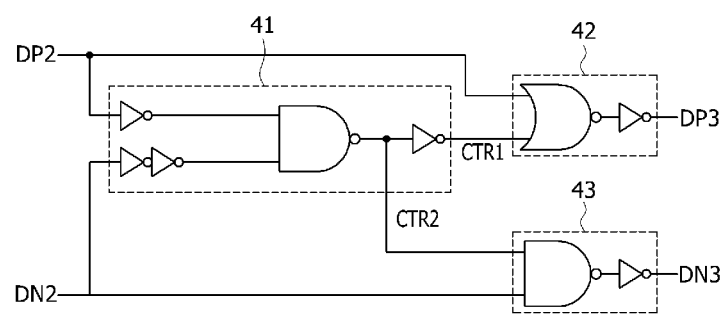
FIG. 6 is a circuit diagram of an example of a drive signal controlling unit in the internal voltage generating circuit illustrated in FIG. 3.

FIG. 6 is a circuit diagram of an example of the drive signal controlling unit 4 in the internal voltage generating circuit illustrated in FIG. 3.

Referring to FIG. 6, the drive signal controlling unit 4 includes a control signal generating unit 41 configured to receive the second pull-up drive signal DP2 and the second pull-down drive signal DN2 and generate a first control signal CTR1 and a second control signal CTR2, a first buffer unit 42 configured to buffer the second pull-up drive signal DP2 and transmit the buffered second pull-up drive signal as the third pull-up drive signal DP3 in response to the first control signal CTR1, and a second buffer unit 43 configured to buffer the second pull-down drive signal DN2 and transmit the buffered second pull-down drive signal as the third pull-down drive signal DN3 in response to the second control signal CTR2. The control signal generating unit 41 generates the first control signal CTR1 of a logic high level and the second control signal CTR2 of a logic low level when the second pull-up drive signal DP2 is activated to a logic low level and the second pull-down drive signal DN2 is activated to a logic high level. By the first control signal CTR1 of a logic high level and the second control signal CTR2 of a logic low level, the third pull-up drive signal DP3 is deactivated to a logic high level and the third pull-down drive signal DN3 is deactivated to a logic low level.

Figure 7:
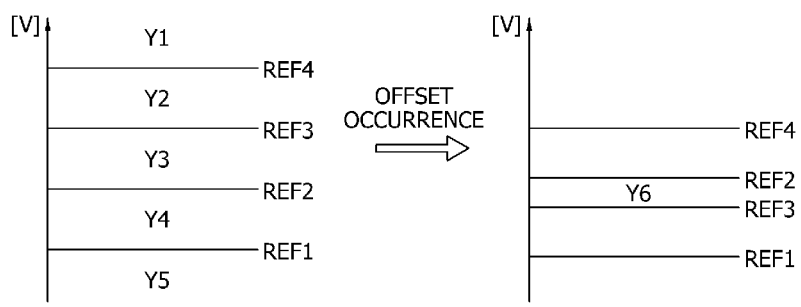
FIG. 7 is a diagram illustrating an example of an operation of the internal voltage generating circuit illustrated in FIG. 3.

FIG. 7 is a diagram illustrating an example of an operation of the internal voltage generating circuit illustrated in FIG. 3.

Referring to FIG. 7, when the internal voltage VINT has a level of a section Y1 higher than the fourth reference voltage REF4, the first pull-up drive signal DP1 and the second pull-up drive signal DP2 generated by the drive signal generating unit 2 are deactivated to a logic high level and the first pull-down drive signal DN1 and the second pull-down drive signal DN2 are activated to a logic high level. In this state, since the first control signal CTR1 generated by the control signal generating unit 41 of the drive signal controlling unit 4 is at a logic low level and the second control signal CTR2 is at a logic high level, the third pull-up drive signal DP3 is deactivated to a logic high level by buffering the second pull-up drive signal DP2 and the third pull-down drive signal DN3 is activated to a logic high level by buffering the second pull-down drive signal DN2. Accordingly, the first driving unit 3 pulls down the internal voltage VINT by the turned-on NMOS transistor N31, and the second driving unit 5 pulls down the internal voltage VINT by the turned-on NMOS transistor N51.

When the internal voltage VINT has a level of a section Y2 lower than the fourth reference voltage REF4 and higher than the third reference voltage REF3, the first pull-up drive signal DP1 and the second pull-up drive signal DP2 generated by the drive signal generating unit 2 are deactivated to a logic low level, the first pull-down drive signal DN1 is deactivated to a logic low level, and the second pull-down drive signal DN2 is activated to a logic high level. In this state, since the first control signal CTR1 generated by the control signal generating unit 41 of the drive signal controlling unit 4 is at a logic low level and the second control signal CTR2 is at a logic high level, the third pull-up drive signal DP3 is deactivated to a logic high level by buffering the second pull-up drive signal DP2 and the third pull-down drive signal DN3 is activated to a logic high level by buffering the second pull-down drive signal DN2. Accordingly, the second driving unit 5 pulls down the internal voltage VINT by the turned-on NMOS transistor N51.

When the internal voltage VINT has a level of a section Y3 lower than the third reference voltage REF3 and higher than the second reference voltage REF2, the first pull-up drive signal DP1 and the second pull-up drive signal DP2 generated by the drive signal generating unit 2 are deactivated to a logic high level and the first pull-down drive signal DN1 and the second pull-down drive signal DN2 are deactivated to a logic low level. In this state, since the first control signal CTR1 generated by the control signal generating unit 41 of the drive signal controlling unit 4 is at a logic low level and the second control signal CTR2 is at a logic high level, the third pull-up drive signal DP3 is deactivated to a logic high level by buffering the second pull-up drive signal DP2 and the third pull-down drive signal DN3 is deactivated to a logic low level by buffering the second pull-down drive signal DN2. Accordingly, the first driving unit 3 and the second driving unit 5 are not driven, thus forming a dead zone.

When the internal voltage VINT has a level of a section Y4 lower than the second reference voltage REF2 and higher than the first reference voltage REF1, the first pull-up drive signal DP1 generated by the drive signal generating unit 2 is deactivated to a logic high level, the second pull-up drive signal DP2 is activated to a logic low level, and the first pull-down drive signal DN1 and the second pull-down drive signal DN2 are deactivated to a logic low level. In this state, since the first control signal CTR1 generated by the control signal generating unit 41 of the drive signal controlling unit 4 is at a logic low level and the second control signal CTR2 is at a logic high level, the third pull-up drive signal DP3 is activated to a logic low level by buffering the second pull-up drive signal DP2 and the third pull-down drive signal DN3 is deactivated to a logic low level by buffering the second pull-down drive signal DN2. Accordingly, the second driving unit 5 pulls up the internal voltage VINT by the turned-on PMOS transistor P51.

When the internal voltage VINT has a level of a section Y5 lower than the first reference voltage REF1, the first pull-up drive signal DP1 and the second pull-up drive signal DP2 generated by the drive signal generating unit 2 are activated to a logic low level and the first pull-down drive signal DN1 and the second pull-down drive signal DN2 is deactivated to a logic low level. In this state, since the first control signal CTR1 generated by the control signal generating unit 41 of the drive signal controlling unit 4 is at a logic low level and the second control signal CTR2 is at a logic high level, the third pull-up drive signal DP3 is activated to a logic low level by buffering the second pull-up drive signal DP2 and the third pull-down drive signal DN3 is deactivated to a logic low level by buffering the second pull-down drive signal DN2. Accordingly, the first driving unit 3 pulls up the internal voltage VINT by the turned-on PMOS transistor P31, and pulls up the internal voltage VINT by the turned-on PMOS transistor P51.

An offset may occur according to a change in PVT (Process, Voltage and Temperature). Also, the level of the third reference voltage REF3 may become lower than the level of the second reference voltage REF2. In this state, when the internal voltage VINT has a level of a section Y6 lower than the second reference voltage REF2 and higher than the third reference voltage REF3, the second pull-up drive signal DP2 generated by the drive signal generating unit 2 is activated to a logic low level and the second pull-down drive signal DN2 is activated to a logic high level. In this state, since the first control signal CTR1 generated by the control signal generating unit 121 of the drive signal controlling unit 12 is at a logic high level and the second control signal CTR2 is at a logic low level, the third pull-up drive signal DP3 is deactivated to a logic high level independent of the second pull-up drive signal DP2 and the third pull-down drive signal DN3 is deactivated to a logic low level independent of the second pull-down drive signal DN2. Accordingly, the PMOS transistor P51 and the NMOS transistor N51 of the second driving unit 5 are turned off, and the internal voltage VINT is not driven, thus forming a dead zone.

As described above, the internal voltage generating circuit of this embodiment does not drive the internal voltage VINT by deactivating both the third pull-up drive signal DP3 and the third pull-down drive signal DN3 for driving the second driving unit 5 even when an offset occurs between the reference voltages. Accordingly, the internal voltage generating circuit of this embodiment can maintain a dead zone and can remove a short-circuit current that is generated when the PMOS transistor P51 and the NMOS transistor N51 are simultaneously turned on.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:
1. An internal voltage generating circuit comprising:
a drive signal generating unit configured to compare an internal voltage with first and second reference voltages and generate a first pull-up drive signal and a first pull-down drive signal;
a drive signal controlling unit configured to buffer the first pull-up drive signal and the first pull-down drive signal and generate a second pull-up drive signal and a second pull-down drive signal, wherein the second pull-up drive signal and the second pull-down drive signal are deactivated when the first pull-up drive signal and the first pull-down drive signal are activated; and a driving unit configured to drive the internal voltage in response to the second pull-up drive signal and the second pull-down drive signal, wherein the first pull-up drive signal is activated when the internal voltage has a lower level than the first reference voltage.

2. The internal voltage generating circuit of claim 1, wherein the first reference voltage has a lower level than the second reference voltage.

3. The internal voltage generating circuit of claim 1, wherein the first pull-down drive signal is activated when the internal voltage has a higher level than the second reference voltage.

4. The internal voltage generating circuit of claim 2, wherein the first pull-up drive signal and the first pull-down drive signal are activated when the first reference voltage has a higher level than the second reference voltage and the internal voltage has a level between the first reference voltage and the second reference voltage.

5. The internal voltage generating circuit of claim 1, wherein the drive signal generating unit comprises:
a first comparator configured to compare the internal voltage with the first reference voltage and generate the first pull-up drive signal; and
a second comparator configured to compare the internal voltage with the second reference voltage and generate the first pull-down drive signal.

6. The internal voltage generating circuit of claim 1, wherein the drive signal controlling unit comprises:
a control signal generating unit configured to receive the first pull-up drive signal and the first pull-down drive signal and generate a first control signal and a second control signal;
a first buffer unit configured to buffer the first pull-up drive signal and transmit the buffered first pull-up drive signal as the second pull-up drive signal in response to the first control signal; and
a second buffer unit configured to buffer the first pull-down drive signal and transmit the buffered first pull-down drive signal as the second pull-down drive signal in response to the second control signal.

7. The internal voltage generating circuit of claim 1, wherein the driving unit pulls up the internal voltage when the second pull-up drive signal is activated, and pulls down the internal voltage when the second pull-down drive signal is activated.

8. An internal voltage generating circuit comprising:
a drive signal generating unit configured to compare an internal voltage with first to fourth reference voltages and generate first and second pull-up drive signals and first and second pull-down drive signals;
a first driving unit configured to drive the internal voltage in response to the first pull-up drive signal and the first pull-down drive signal;
a drive signal controlling unit configured to buffer the second pull-up drive signal and the second pull-down drive signal and generate a third pull-up drive signal and a third pull-down drive signal, wherein the third pull-up drive signal and the third pull-down drive signal are deactivated when the second pull-up drive signal and the second pull-down drive signal are activated; and a second driving unit configured to drive the internal voltage in response to the third pull-up drive signal and the third pull-down drive signal.

9. The internal voltage generating circuit of claim 8, wherein the second reference voltage has a higher level than the first reference voltage, the third reference voltage has a higher level than the second reference voltage, and the fourth reference voltage has a higher level than the third reference voltage.

10. The internal voltage generating circuit of claim 9, wherein the first pull-up drive signal is activated when the internal voltage has a lower level than the first reference voltage.

11. The internal voltage generating circuit of claim 10, wherein the second pull-up drive signal is activated when the internal voltage has a lower level than the second reference voltage.

12. The internal voltage generating circuit of claim 11, wherein the first pull-down drive signal is activated when the internal voltage has a higher level than the fourth reference voltage.

13. The internal voltage generating circuit of claim 12, wherein the second pull-down drive signal is activated when the internal voltage has a higher level than the third reference voltage.

14. The internal voltage generating circuit of claim 9, wherein the second pull-up drive signal and the second pull-down drive signal are activated when the second reference voltage has a higher level than the third reference voltage and the internal voltage has a level between the second reference voltage and the third reference voltage.

15. The internal voltage generating circuit of claim 8, wherein the drive signal generating unit comprises:
a pull-up drive signal generating unit configured to compare the internal voltage with the first and second reference voltages and generate the first and second pull-up drive signals; and
a pull-down drive signal generating unit configured to compare the internal voltage with the third and fourth reference voltages and generate the first and second pull-down drive signals.

16. The internal voltage generating circuit of claim 15, wherein the pull-up drive signal generating unit comprises:
a first comparator configured to compare the internal voltage with the first reference voltage and generate the first pull-up drive signal; and
a second comparator configured to compare the internal voltage with the second reference voltage and generate the second pull-up drive signal,
wherein the first comparator is configured to deactivate the first pull-up drive signal when the second pull-up drive signal is deactivated.

17. The internal voltage generating circuit of claim 15, wherein the pull-down drive signal generating unit comprises:
a first comparator configured to compare the internal voltage with the fourth reference voltage and generate the first pull-down drive signal; and
a second comparator configured to compare the internal voltage with the third reference voltage and generate the second pull-down drive signal,
wherein the first comparator is configured to deactivate the first pull-down drive signal when the second pull-down drive signal is deactivated.

18. The internal voltage generating circuit of claim 8, wherein the drive signal controlling unit comprises:

a control signal generating unit configured to receive the second pull-up drive signal and the second pull-down drive signal and generate a first control signal and a second control signal;

a first buffer unit configured to buffer the second pull-up drive signal and transmit the buffered second pull-up drive signal as the third pull-up drive signal in response to the first control signal; and a second buffer unit configured to buffer the second pull-down drive signal and transmit the buffered second pull-down drive signal as the third pull-down drive signal in response to the second control signal.

19. The internal voltage generating circuit of claim 8, wherein the first driving unit pulls up the internal voltage when the first pull-up drive signal is activated, and pulls down the internal voltage when the first pull-down drive signal is activated.

20. The internal voltage generating circuit of claim 8, wherein the second driving unit pulls up the internal voltage when the third pull-up drive signal is activated, and pulls down the internal voltage when the third pull-down drive signal is activated.

* * * * *